US006316283B1

(12) United States Patent
Saurer

(10) Patent No.: US 6,316,283 B1
(45) Date of Patent: Nov. 13, 2001

(54) BATCH MANUFACTURING METHOD FOR PHOTOVOLTAIC CELLS

(75) Inventor: Eric Saurer, Bevaix (CH)

(73) Assignee: Asulab SA, Bienne (CH)

( * ) Notice: Subject to any disclaimer, the term of this patent is extended or adjusted under 35 U.S.C. 154(b) by 0 days.

(21) Appl. No.: 09/258,277

(22) Filed: Feb. 26, 1999

(30) Foreign Application Priority Data

Mar. 25, 1998 (CH) .......................................... 0700

(51) Int. Cl.[7] .................................................. H01L 21/00
(52) U.S. Cl. ............................ 438/52; 427/74; 136/249; 136/251
(58) Field of Search .................................. 438/52, 57, 68; 427/74, 75; 136/243, 244, 245, 249, 251

(56) References Cited

U.S. PATENT DOCUMENTS

| 4,410,558 | * | 10/1983 | Izu et al. ................................. | 427/39 |
| 4,485,264 | * | 11/1984 | Izu et al. ................................. | 136/244 |
| 5,202,271 | * | 4/1993 | Kouzuma et al. ...................... | 438/64 |
| 5,457,057 | | 10/1995 | Nath et al. .............................. | 438/67 |
| 5,516,704 | | 5/1996 | Yoshida .................................. | 438/62 |
| 5,912,064 | * | 6/1999 | Azuma et al. ......................... | 428/141 |

FOREIGN PATENT DOCUMENTS 197 679     10/1986   (EP) .

OTHER PUBLICATIONS

Patent Abstract of Japan, vol. 101, No. 282 (P–500), Sep. 25, 1986.
Patent Abstracts of Japan, vol. 008, No. 053 (E–231) Mar. 9, 1984.

* cited by examiner

*Primary Examiner*—Carl Whitehead, Jr.
*Assistant Examiner*—Jeff Vockrodt
(74) *Attorney, Agent, or Firm*—Sughrue, Mion, Zinn, Macpeak & Seas, PLLC

(57) ABSTRACT

The invention concerns a batch manufacturing method for a plurality of individual photovoltaic cells (22), including the following steps:
  (a) providing at least one strip (1) of conductive material,
  (b) cutting in succession in said strip (1) substrates (2) having the shape and the dimensions of the desired cells (22),
  (c) replacing the cut substrates (2) in the strip (1)
  (d) depositing semi-conductor materials (16) forming at least one n-i-p or p-i-n junction on one of the faces (4a) of the strip (2),
  (e) depositing a transparent layer of conductive material on top of said semi-conductor materials (16),
  (f) removing from the strip (1) the cut substrates (2) coated with said semi-conductor materials (16) and the upper electrode (18) to form individual photovoltaic cells (22) which are ready for use.

15 Claims, 5 Drawing Sheets

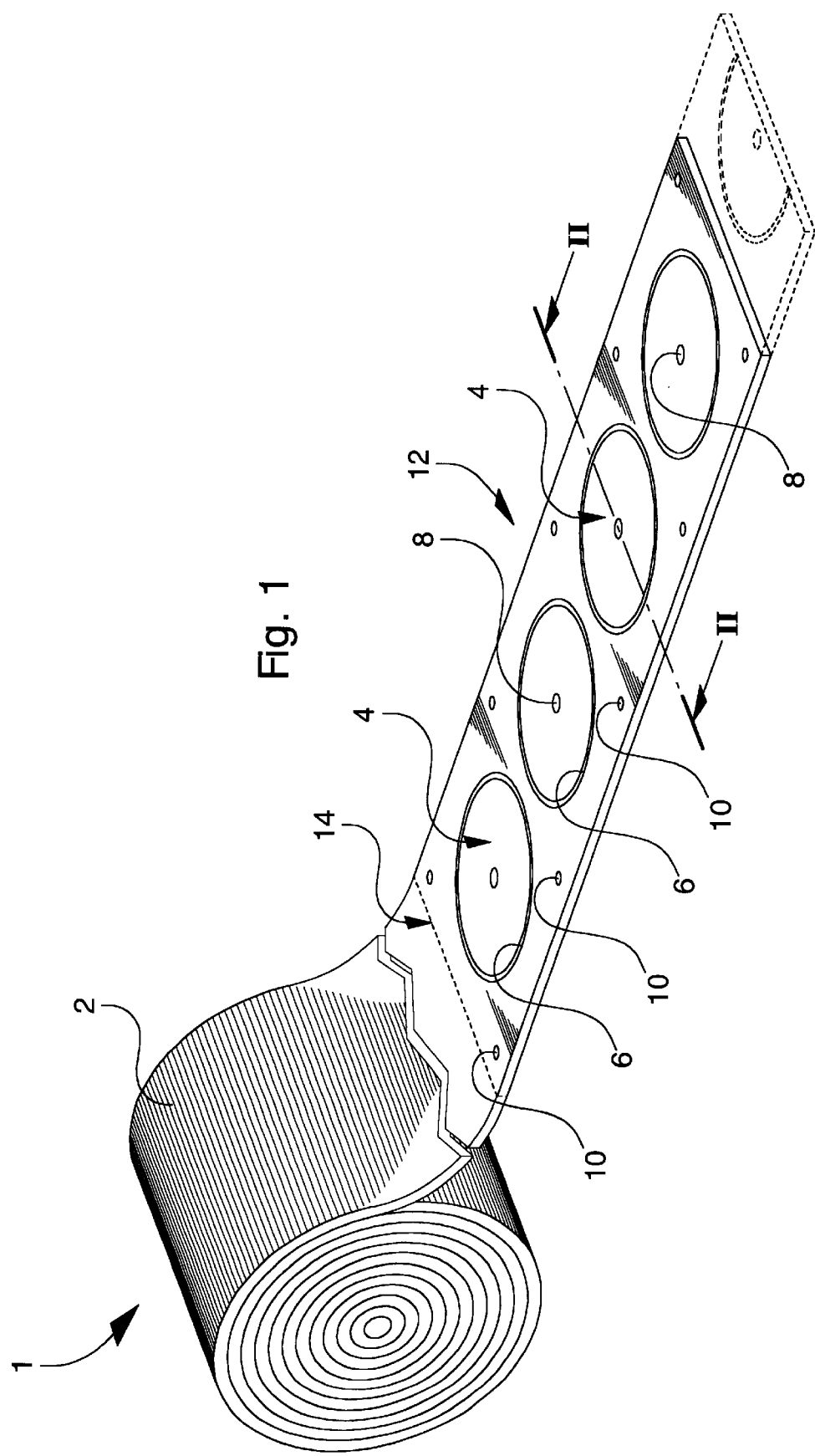

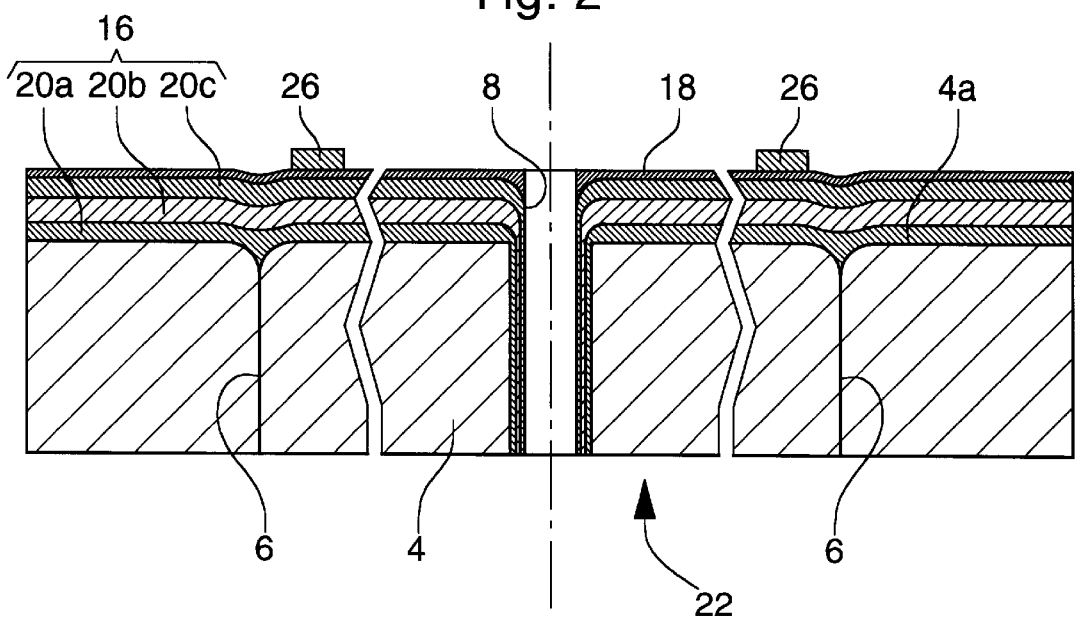
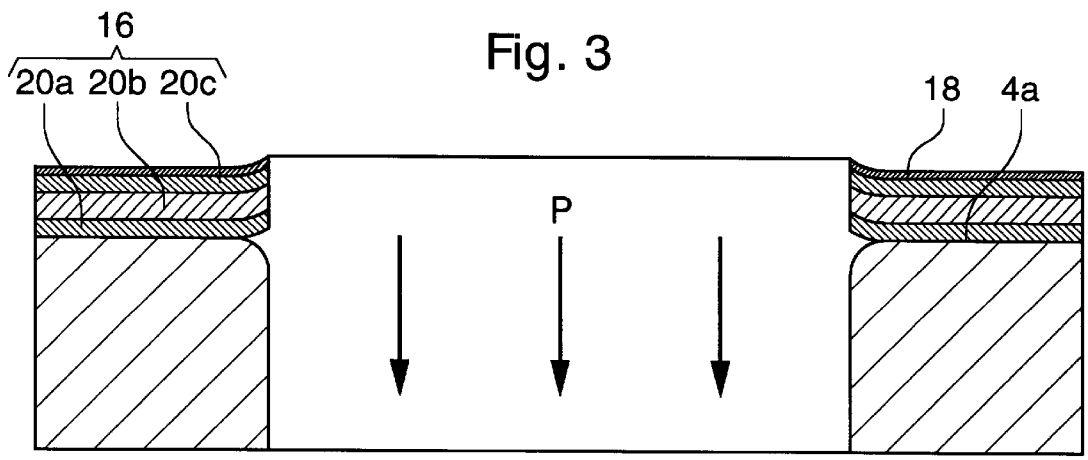
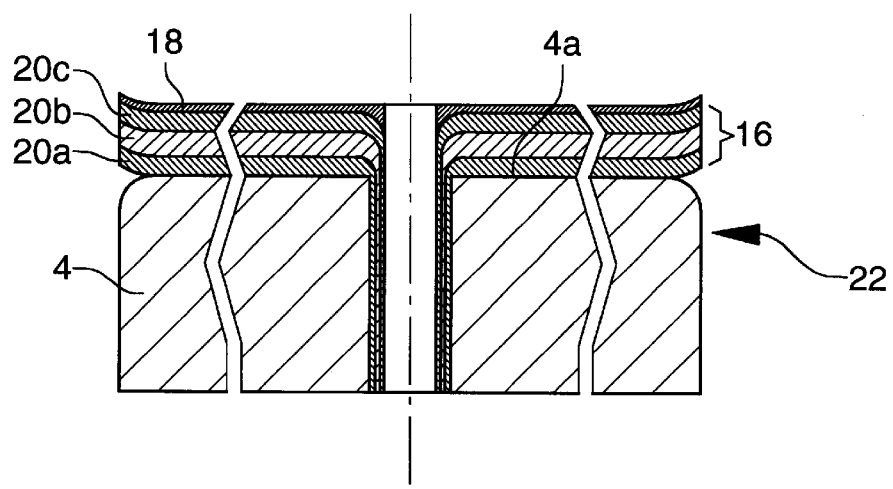

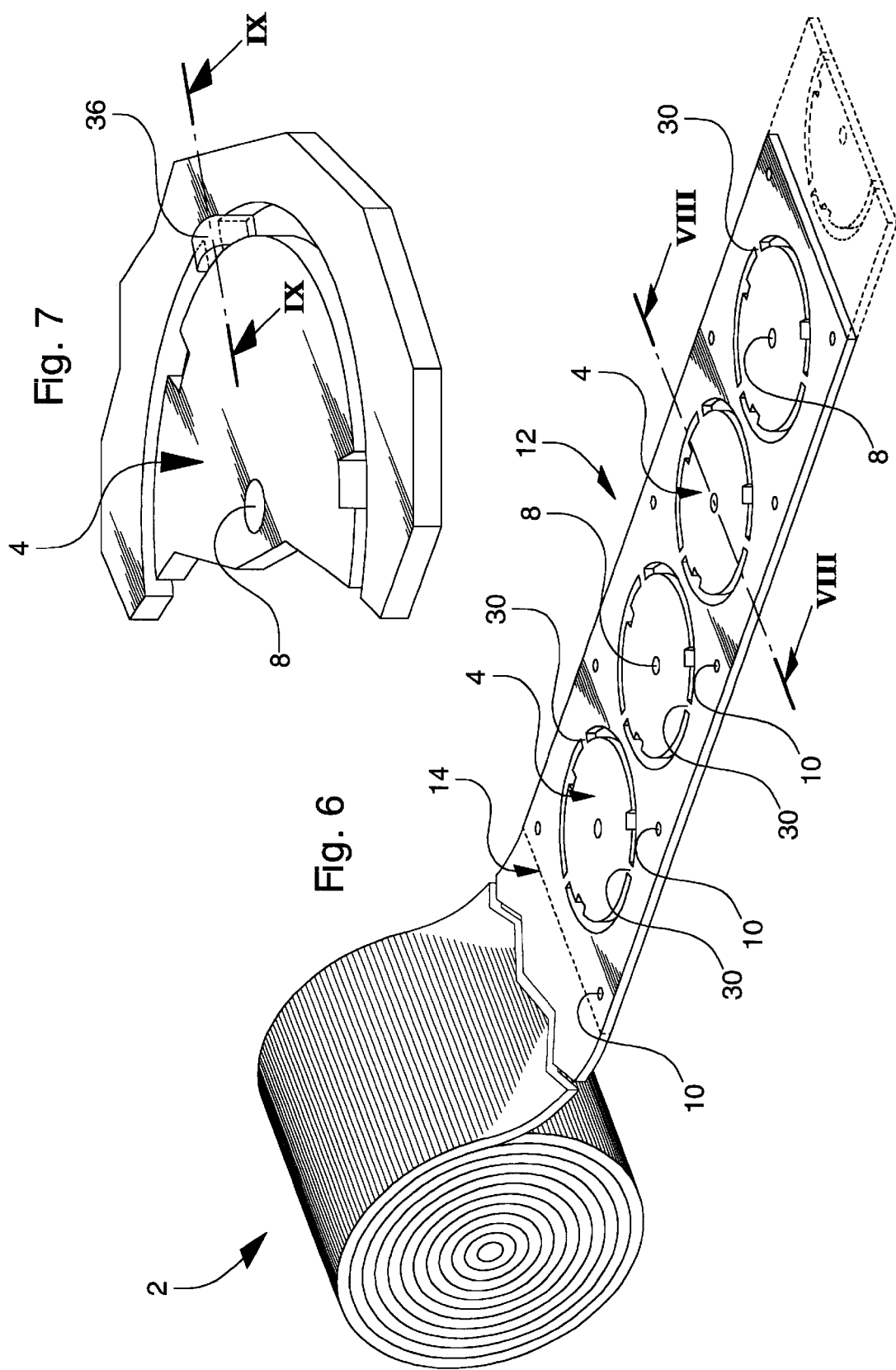

BATCH MANUFACTURING METHOD FOR PHOTOVOLTAIC CELLS

BACKGROUND OF THE INVENTION

The present invention concerns a manufacturing method for a plurality of photovoltaic cells and more particularly a method for the batch manufacture of a plurality of such cells.

Photovoltaic cells, more commonly designated solar cells, are semi-conductor junction devices which convert luminous energy into electric power. The typical structure of a photovoltaic cell essentially includes five layers, namely a first and second electrode, and a composite body of semi-conductor material which is inserted between the two electrodes and which includes three superposed layers forming an n-i-p or p-i-n junction. One of the two electrodes is transparent to light. When the light reaches the layers forming the photovoltaic semi-conductor body, the device generates a voltage across the electrodes which increases with the increase in light intensity.

These solar cells are widely used in consumer products such as watches or electronic calculators, as well as in industrial products for the generation of electric power from solar energy.

The industrial scale batch manufacture of this type of cell is relatively recent and has for a long time been limited by the absence of appropriate cell manufacturing techniques. Manufacturing techniques have however recently been developed for making reliable photovoltaic cells on an industrial scale at a low cost.

U.S. Pat. No. 4,485,125 discloses such a method for continuously manufacturing a plurality of solar cells on an elongated web of substrate material. According to this method, layers of semi-conductor materials forming at least one n-i-p or p-i-n junction of very high quality are continuously deposited by plasma on a flexible substrate extending from a pay off reel to a take up reel. The product obtained by such a method typically includes a web or strip of conductive material forming the substrate and lower electrode, this strip being coated with three successive respectively n-i-p layers of semi-conductor materials and a layer of a transparent conductive material forming an upper electrode. This strip can be several tens of centimetres wide and several tens of meters long, and can be considered as a single photovoltaic cell of very large dimensions. It must consequently be divided into devices of smaller dimensions in order to be adapted to final applications.

U.S. Pat. No. 5,457,057 discloses a method for manufacturing photovoltaic cells from strips such as those obtained by the method disclosed in U.S. Pat. No. 4,485,125. According to this latter method, the strip is divided for example by being sheared or sawed into individual cells during a first step, the individual cells being then connected in modules including several individual cells via connecting tapes. However, the step of dividing the strip into individual cells involves numerous short-circuiting defects in proximity to the cutting edges of the cells, in particular following accidental contact between the upper electrode and the lower electrode. This method thus requires additional steps for checking and testing each cell after cutting. Such a method does not therefore allow the cells to be used as they are immediately after the cutting step and consequently reduces the efficiency of the method.

In order to overcome this drawback, U.S. Pat. No. 5,457,057 proposes removing the defects resulting from the cutting step during two subsequent steps. A first step consists in insulating, on the individual cut cells, a central active region from the peripheral region including the aforementioned defects resulting from the cutting step. For this purpose, it is proposed to remove the layers of material forming the upper electrode and the semi-conductor materials forming the n-i-p or p-i-n junction along the contour of the cells to expose the substrate. The removal of these layers can be achieved by scribing, chemical etching or using a laser beam. During a second step, the peripheral region including the cutting defects is separated from the central region by being cut from the substrate from the back of the cell in the zone where the layers have been removed. According to an alternative which is also disclosed in this method, the peripheral region is kept and used for making connecting means for the cell.

The removal of the semi-conductor layers forming the junction is particularly difficult since it requires the implementation either of very aggressive chemical products or a difficult method for ablating said layers by laser or scribing which can also cause short-circuits.

Moreover, conservation of the peripheral region results in a cell whose space requirement can be more significant for a given active region. This additional space requirement can constitute a considerable limitation on the use of these cells in certain applications in which they have to be incorporated in objects of small dimensions such as wristwatches and suchlike.

The principal object of the present invention is thus to overcome the drawbacks of the aforementioned prior art by providing a batch manufacturing method for photovoltaic cells wherein a plurality of photovoltaic cells are made in a single batch, this batch being then able to be easily divided into individual cells without any risk of damage to the cells and without any risk of creating short-circuits between the different layers forming each cell.

Therefore, according to a first aspect, the invention concerns a batch manufacturing method for a plurality of individual photovoltaic cells, each cell including:
- an electrically conductive substrate forming a first electrode;
- a second transparent or semi-transparent electrode and photovoltaic semi-conductor body forming the junction arranged between the first and the second electrode;

the method being characterised in that it includes at least the following steps:
- (a) providing at least one strip of conductive material,
- (b) punching in succession in said strip substrates forming the lower electrodes along a cutting line substantially defining the shape and the dimensions of the desired cells,
- (c) replacing the cut substrates in the strip in the locations where they were cut out,
- (d) depositing on one of the faces of the strip semi-conductor materials forming at least one n-i-p or p-i-n junction,
- (e) depositing a transparent or semi-transparent layer of electrically conductive material on top of said semi-conductor materials to form an upper electrode, and
- (f) removing from the strip the cut substrates coated with the semi-conductor materials and the upper electrode to form individual photovoltaic cells.

The use of the technique consisting in punching substrates having the dimensions of a desired individual cell in a strip of conductive material, then replacing the cut substrates in the strip at the very locations where they were cut out, is a simple, reliable, rapid and consequently particularly economical cutting technique.

Moreover, prior to the removal step, this method allows a series of steps to be performed on the strip for the purpose of forming a plurality of finished photovoltaic cells, including, in particular, the step of transferring markings onto the cells in the event that the latter are intended to form dials for timepieces or suchlike and, if necessary, the deposition of contact pads which facilitates the connection of the individual finished cells.

This method is particularly advantageous compared to methods of the prior art in that the removal of the individual strips from the strip of conductive material is achieved by simple pressure applied to the cells, and thus does not require the use of a laser or water jet cutting device which is complex and expensive to implement. Furthermore, after removal from the strip, the individual cells no longer need to be subjected to subsequent treatment steps, with the exception, if required, of a test step. The method according to the invention thus provides cells which are ready to be used.

According to a second aspect, the invention also concerns a batch manufacturing method for a plurality of individual photovoltaic cells, each cell including:
 an electrically conductive substrate forming a first electrode,
 a second transparent or semi-transparent electrode and a semi-conductor photovoltaic body disposed between the first and the second electrode,
the method being characterised in that it includes at least the following steps:
 (a) providing at least one strip of conductive material,
 (b) cutting out in succession in said strip substrates which form the lower electrode for each cell and which have the dimensions of the desired cell, so that each of said substrates is connected to the rest of the strip by at least one bridge of material,
 (c) depositing semi-conductor materials forming at least one n-i-p or p-i-n junction on one of the faces of the strip,
 (d) depositing a transparent or semi-transparent layer of an electrically conductive material on top of said semi-conductor materials to form an upper electrode, except over the bridge or bridges of material,
 (e) removing from the strip, by cutting out the bridge or bridges of material at the location which is not coated with said transparent or semi-transparent material, the substrates coated with said semi-conductor materials and the upper electrode to form individual photovoltaic cells.

As a result of these features, any short-circuiting problem which might result from plastic flow of the upper electrode during the cutting out of the finished individual cells, is avoided since the conductive material has been removed above the bridges of material which are intended to be cut.

In an advantageous manner, it will also be noted that, according to the method of the invention, the cells held on the conductive strip by said bridges of material are electrically insulated from each other. This allows, in particular, the cells to be tested while they are still on the strip and defective cells to be marked. Once marked, the defective cells can be ignored during the subsequent manufacturing steps, such as marking or decorative design transfer steps, in particular when such cells are intended to form dials for timepieces or suchlike.

According to an advantageous feature common to both aspects of the invention, the strip is cut into sections of strip, each including a predetermined number of cells, prior to execution of the step of depositing said semi-conductor materials and the layer of transparent or semi-transparent material.

According to another advantageous feature common to both aspects of the invention, the layer of semi-conductor material is plasma deposited, while the transparent or semi-transparent layer forming the upper electrode is deposited by vapor deposition. It will be noted that this latter method is directional and does not cover or barely covers the flanks perpendicular to the plane of the substrate.

This feature is particularly advantageous in conjunction with the second aspect of the invention. Indeed, plasma deposition of the layer of semi-conductor materials leads to the covering of the external edges and flanks of each substrate forming the lower electrode, so that the substrate is perfectly electrically insulated from the transparent or semi-transparent layer which is subsequently deposited, given the high resistivity of the semi-conductive layers forming the junction. The arrangement of a margin on the periphery of each cell is thus avoided, which allows the active surface of each cell to be increased. This moreover improves the aesthetic appearance of the cell, which is important in the event of the use of such a cell as a timepiece dial.

BRIEF DESCRIPTION OF THE DRAWINGS

Other features and advantages of the present invention will appear in the following description of a preferred embodiment of the method according to the invention, given by way of non-limiting example with reference to the annexed drawings, in which:

FIG. 1 is a schematic perspective view of a strip in which the elements forming the substrate and the lower electrode of the cells are punched then replaced in the strip according to a first embodiment of the method of the invention, the strip subsequently being cut into sections;

FIG. 2 is a partial cross-section along the line II—II of FIG. 1 of a section of strip coated with the semi-conductor materials forming a semi-conductor photovoltaic n-i-p or p-i-n junction and with the upper electrode prior to the step of removing the individual cells, FIG. 3 is a similar view to that of FIG. 2 after the removal step, FIG. 6 is a schematic perspective view of a strip in which the substrates forming the lower electrodes of the cells are cut according to a second embodiment of the method of the invention, the strip having been cut into sections of strip, FIG. 7 is a partial perspective view of a section of strip prior to the step of depositing the material intended to form the upper electrode.

DETAILED DESCRIPTION OF THE INVENTION

The description of the invention will be made within the scope of an application to the manufacture of a circular photovoltaic cell forming a dial for a timepiece such as a watch. It goes without saying however that the invention is in no way limited to this application, and that it could be used within the scope of the manufacture of photovoltaic cells of any other shape and applied to any other type of electric instruments, in particular low power consumption instruments.

Figure 4:
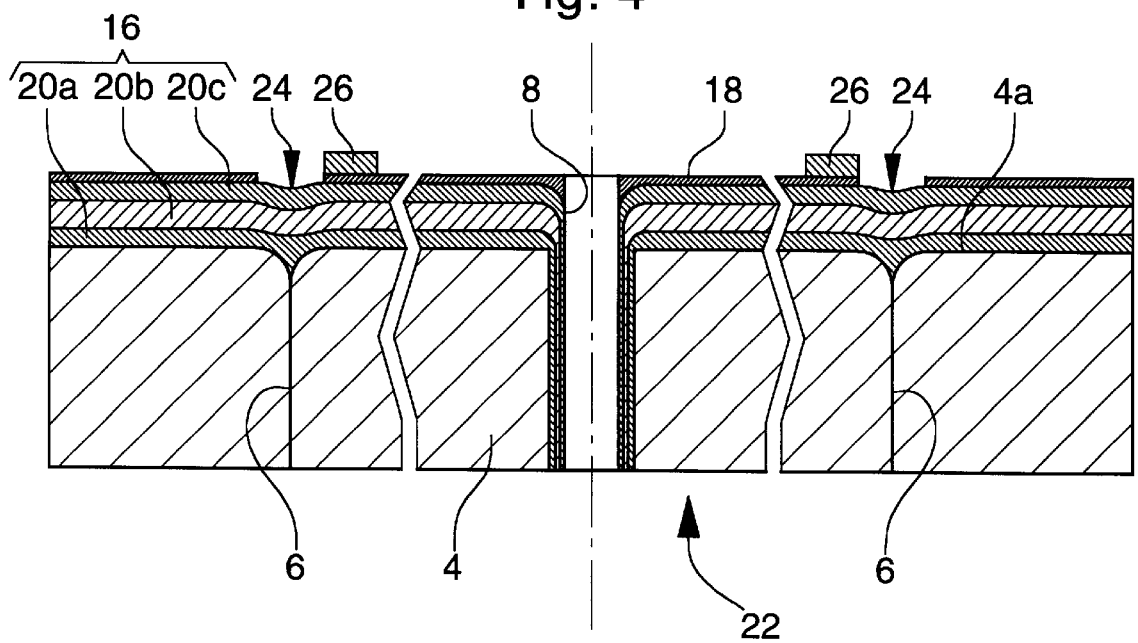
FIG. 4 is a similar view to that of FIG. 2 of an alternative embodiment of the method according to the invention.
Figure 5:
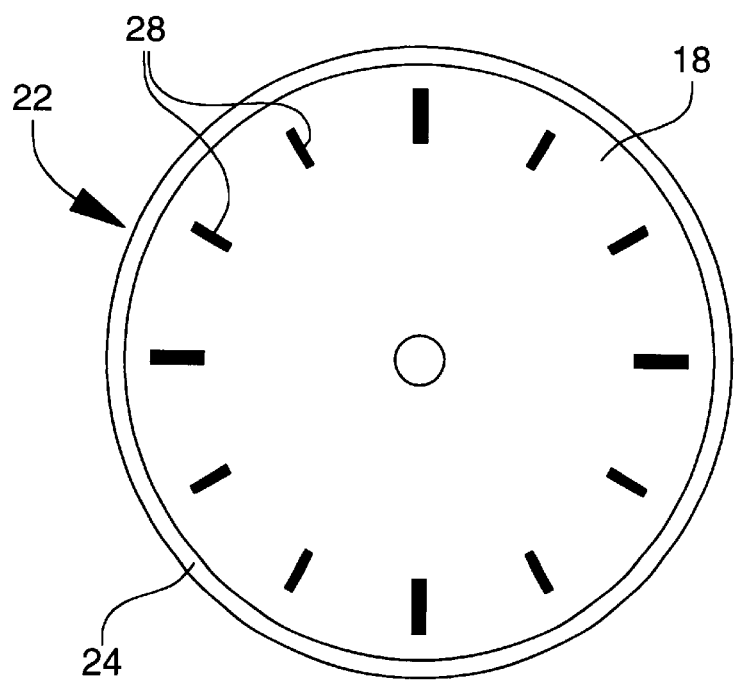
FIG. 5 is a top view of the photovoltaic cell shown in FIG. 4 once detached from the section of strip.

With reference first of all to FIGS. 1 to 5, a first embodiment of the method according to the invention will be described.

FIG. 1 illustrates a strip 2 of electrically conductive material intended to form the substrate 4 forming the lower electrode 4 of a plurality of individual photovoltaic cells including in particular the semi-conductive layers forming the junction of the cells. Strip 2 is typically made of stainless steel. Of course other metal materials, compatible with the nature of the semi-conductive layers forming the junction in the deposition conditions thereof, could be envisaged.

According to an alternative, strip 2 can be made of an insulating material and coated on one of its faces with a layer of electrically conductive material. In the remainder of the text <<electrically conductive strip>> thus means a strip made of metal material or a strip made of an insulating material coated with a layer of conductive material.

In the example shown in FIG. 1, strip 2 is supplied from a pay off reel 1 which supplies a punching station (not shown). In this station, substrates 2 are successively punched using an appropriate punch and die along a cutting line 6 substantially defining the final shape and dimensions of the desired photovoltaic cells.

It will be noted that, in this particular case, the punch and die are provided to form, simultaneously with the cutting of the contour of the cells, a hole 8 substantially at the centre of each substrate 4 to allow the subsequent passage of shafts onto which the hands of the timepiece, to which the photovoltaic dial is intended to be fitted, will be fixed. Indexing and driving holes 10 are also provided, such holes allowing accurate positioning of the sections of strip to be assured during subsequent steps such as the transfer of a design onto the finished cells.

Immediately after the punching step, the cut out substrates 2 are replaced in strip 2 at the locations where they were cut out in accordance with a known technique. It will be noted that the cut out portion is held in the strip by micro-welds which are spontaneously created when the punched part is driven into the location in the strip from which it came.

After this step of replacing substrates 2 in the strip, strip 2 is cut into sections of strip 12 each including a determined number of substrates 2, conventionally about ten. A cutting line 14 on strip 2 for the cutting thereof into sections 12 is represented by a dotted line in FIG. 1. The step of cutting strip 2 into sections 12 is typically performed by punching, shearing, sawing or any other means known to those skilled in the art. The advantage of cutting strip 2 into sections 12 is that sections 12 can easily be held flat and thus manipulated without the risk of substrates 4 becoming detached following excessive bending of said sections 12 creating stress in the strip capable of breaking the connection of the cut out substrate to the strip into which it has been reintroduced.

Sections of strip 12 are then placed in storage cassettes and subsequently introduced into different successive chambers in which semi-conductor materials forming at least one n-i-p or p-i-n junction 16 are deposited on front face 4a of substrates 4, then a transparent or semi-transparent layer 18 of an electrically conductive material is deposited onto semi-conductor materials 16 (FIGS. 2 and 3), the assembly forming the structure of the photovoltaic cell.

Semi-conductor materials 16 are deposited in accordance with a conventional PECVD (Plasma Enhanced Chemical Vapor Deposition) method described for example in the document <<Electronic materials >> edited by Miller & Mullin Plenum Press New York in 1991 in the <<Amorphous Silicon Electronics >> chapter, pages 143 et seq.

As is clear in FIGS. 2 and 3, the structure of the photovoltaic cell includes three thin layers 20a, 20b and 20c respectively p-i-n or n-i-p layers, sandwiched between substrate 4 and layer 18 which forms the upper electrode of the photovoltaic cell.

Typically in the case of a p-i-n junction, layer 20a is a hydrogenous amorphous silicon layer (a—Si:H) doped with boron to obtain p type conductivity, layer 20b is an intrinsic i layer and layer 20c is a hydrogenous amorphous silicon layer doped with phosphorous to obtain n type conductivity.

Transparent or semi-transparent layer 18 is deposited in a conventional manner by vapor deposition. In the case of a transparent layer, layer 18 is typically made of a mixture of indium and tin oxide ITO. In the case of a semi-transparent layer, layer 18 is typically a metal layer for example aluminium, silver, platinum, palladium, nickel, titanium or rhodium or gold.

It will be noted that the drawing does not reflect the exact dimensions of the different layers, the dimensions having been greatly exaggerated for the purposes of illustration and clarity. In order to provide an idea, the thickness of strip 2 is typically of the order of 0.5 millimetres, the thickness of layers 20a and 20c is typically of the order of 10 to 30 nanometers, and the thickness of layer 18 is of the order of 50 to 200 nanometers when the layer is transparent, and of the order of 20 to 50 nanometers when the layer is semi-transparent.

After the deposition of layers 20a, 20b, 20c and 18, previously cut and coated substrates 2 are removed from each section of strip 12 in order to obtain individual photovoltaic cells 22 which are ready for use. In order to do this, pressure is applied perpendicular to each cell 22 to be removed, on the side of electrode 18, as is shown in FIG. 3. This step can for example be performed automatically using a simple plunger which pushes cell 22 downwards. It will be noted that during removal, layers 20a, 20b, 20c and 18 are broken, the downward removal movement tending to lift the layer assembly upwards. This removal method is particularly advantageous since upper electrode 18 is moved away from lower electrode 4 with which it is liable to cause a short-circuit.

According to an alternative embodiment of the method, the material of layer 18 is removed in a peripheral zone 24 of each individual cell 22 prior to the removal step, in order to electrically insulate cells 22 from each other. Once insulated, cells 22 have the advantage of being able to be electrically tested while they are still attached to section of strip 12. The removal of the material of layer 18 in zone 24 is performed in a conventional manner for example via a photosensitive resin mask which is deposited on top of layer 18 and by exposing to UV light the portions of layer 18 which one wishes to protect and then dissolving the non-exposed resin portion. The removal of these apparent portions of layer 18 is typically performed by chemical etching, for example using an etchant including 4 volumes of phosphoric acid, 4 volumes of acetic acid and one volume of nitric acid and one volume of water when the material of layer 18 is aluminium. The protective mask is then removed from the surface of section of strip 12. It will be noted in this regard that peripheral zone 24 extends partially into the surface of each individual cell 22.

An alternative embodiment of the method could of course consist in depositing a protective lacquer on zone 24 prior to the deposition of the material of layer 18, depositing material 18 onto layer 16 and onto the lacquer mask covering zone 24, then dissolving the lacquer mask and the material of layer 18 to allow zone 24 to appear.

The present method can further include, prior to the removal step, a step of forming at least one contact pad 26 on top of upper electrode 18 for each cell 22. Contact pad 26 is made for example by deposition of a highly conductive material, such as a metal paste, a conductive lacquer or suchlike. It will be noted that contact pad 26 preferably extends continuously over the periphery of cell 22 in order to minimise the series resistance thereof, without however extending above cutting line 6.

The method according to the invention can further include a step consisting in transferring, for each cell 22, a design and/or markings such as an hour circle 28 (FIG. 5) onto the surface of upper electrode 18. This step is preferably performed prior to the removal step and as necessary prior to the electric test step of the cells, so that the transfer step is only performed on those cells 22 which are declared operational.

Once made, cells 22 can be packaged in any appropriate way facilitating the subsequent manipulation thereof.

Figure 8:
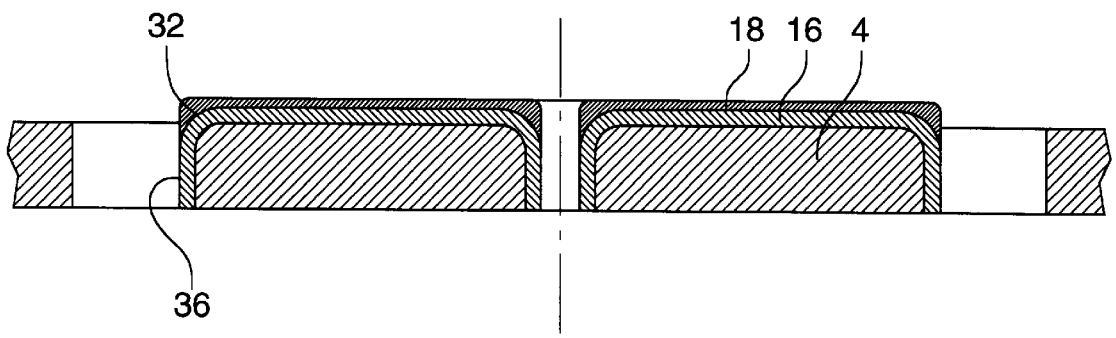
FIG. 8 is a cross-section along the line VIII—VIII of FIG. 7.
Figure 9:
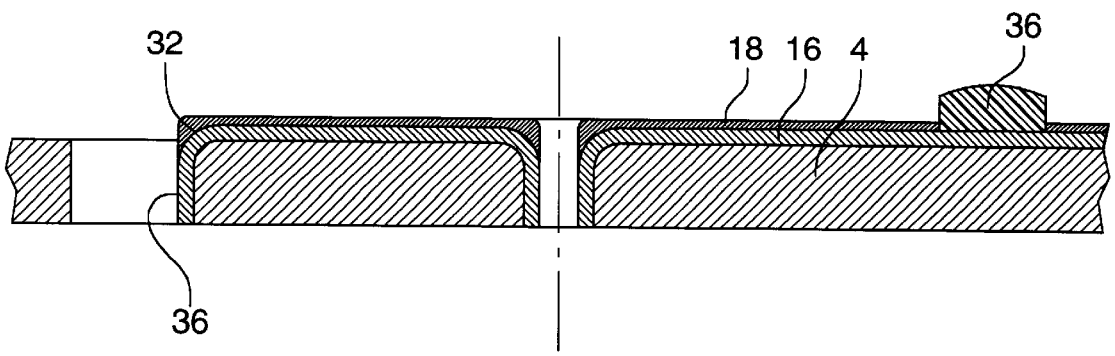
FIG. 9 is a cross-section along the line IX—IX of FIG. 7 after the step of depositing the upper electrode.
Figure 10:
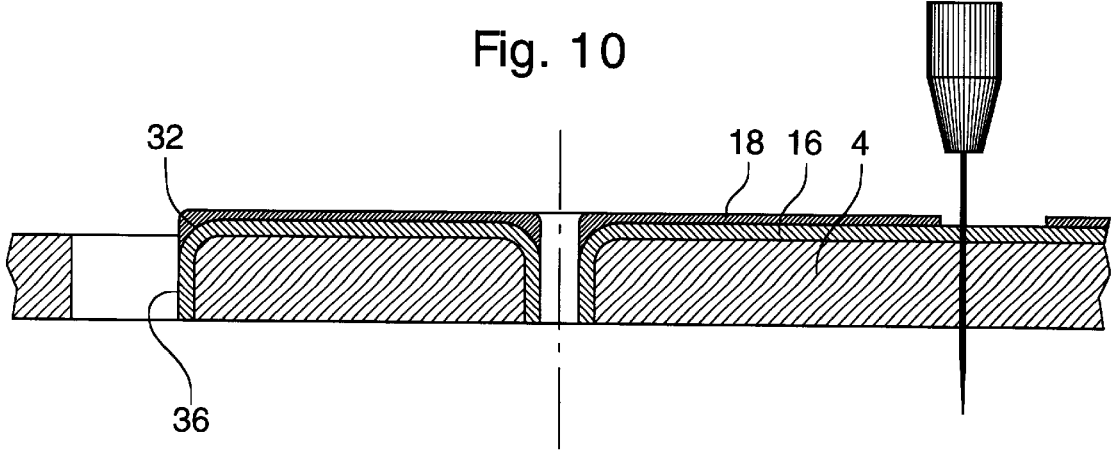
FIG. 10 is a similar cross-section to that of FIG. 9 during the step in which the individual cells are cut out.

With reference now to FIGS. 6 to 10, a second embodiment of the method according to the invention will be described. In these Figures, the elements identical to those described in conjunction with FIGS. 1 to 5 have been designated by the same numerical references.

Unlike the embodiment shown in FIGS. 1 to 5, substrates 2 are cut from strip 2 so that each of such substrates 2 remains linked to the rest of strip 2 by at least one bridge of material 30. For purposes of rapidity and simplicity, this cutting step is preferably performed by using a punch and a die having an appropriate shape corresponding to the contour of the desired cell 22. As in the previous embodiment, holes 8 are made at the same time as the punching of the contour of substrate 4. It goes without saying that other cutting means can be envisaged. Laser beam and high pressure water jet cutting will be mentioned in this regard.

The number of bridges 30 connecting each substrate 4 to the rest of strip 2 varies as a function of the shape of said substrate 4. Typically, these bridges 30 are three in number and are distributed in a regular manner on the periphery of substrate 4 in the case of a circular substrate. In the case of a rectangular substrate, these bridges 30 can be four in number, i.e. for example, one at each angle of substrate 4.

Punched strip 2 is then cut into sections of strip 12 which are arranged flat in boxes or cassettes for the purpose of the subsequent deposition of semi-conductor materials forming the n-i-p or p-i-n junction 16 in accordance with the description given with the first embodiment of the invention.

It will be noted that this plasma deposition step covers not only front face 4a of substrates 4, but also the edges 32 and external flanks 34 thereof, with however a smaller thickness.

The following step consists in depositing transparent or semi-transparent layer 18 on top of semi-conductor materials 16.

According to this embodiment, and in order to avoid any short-circuiting problem between upper electrode 18 and substrate 4 induced during the subsequent step of removing cells 22 from sections of strip 12 by cutting bridges 30, these bridges 30 must not comprise the material forming upper electrode 18.

In order to do this, bridges 30 are protected via a protective material 36 such as a lacquer or protective resin prior to performance of the step of depositing layer 18 which is effected as previously described in conjunction with the first embodiment. Typically, protective material 36 is a synthetic resin which is automatically deposited in the form of a drop by a feed mechanism and which is removed for example by dissolving the resin after the deposition of layer 18, simultaneously removing the material of layer 18 which is on top of bridges 30.

According to an alternative, it is of course possible not to deposit protective material prior to the deposition of layer 18, but to remove the material forming this layer above bridges 30 afterwards, for example by selective chemical etching by means of a protective mask of an appropriate shape.

Cells 22 are then removed from sections of strip 12 by cutting, to form individual photovoltaic cells 22 which are ready for use. Preferably, the cutting is performed by punching using a punch 38 which is partially shown in FIG. 10. Of course, cutting using a laser beam or water jet can also be envisaged.

Like the method of the first embodiment, this method can further include, prior to the removal step, a step of forming contact pads 26, an electric test step of cells 22, and a design and/or marking transfer step.

What is claimed is:

1. A batch manufacturing method for a plurality of individual photovoltaic cells, each cell including:
    an electrically conductive substrate forming a first electrode;
    a second transparent or semi-transparent electrode and a photovoltaic semi-conductor body including three superposed layers forming an n-i-p or p-i-n junction and arranged between the first and the second electrodes;
    the method including at least the following steps:
        (a) providing at least one strip of conductive material,
        (b) cutting out in succession, in said strip, the electrically conductive substrates forming lower electrodes along a cutting line substantially defining a shape and dimensions of the individual photovoltaic cells,
        (c) replacing the cut substrates in the strip in locations where they were cut out,
        (d) depositing, on one of the faces of the strip, said three superposed layers forming an n-i-p or p-i-n junction to form said body,
        (e) depositing a transparent or semi-transparent layer of electrically conductive material on top of said body to form an upper electrode, and
        (f) removing from the strip the cut substrates coated with said body and the upper electrode to form the individual photovoltaic cells.

2. A batch manufacturing method for a plurality of individual photovoltaic cells, each cell including:
    an electrically conductive substrate forming a first electrode,
    a second transparent or semi-transparent electrode and semi-conductor photovoltaic body disposed between the first and the second electrodes,
    the method including at least the following steps:
        (a) providing at least one strip of conductive material, (b) cutting out in succession, in said strip, the electrically conductive substrates which form lower electrodes for each cell and which have dimensions of the individual photovoltaic cells, so that each of the substrates is connected to the rest of the strip by at least one bridge of material, (c) depositing semi-conductor materials forming at least one n-i-p or p-i-n junction on one the faces of the strip, (d) depositing a transparent or semi-transparent layer of an electrically conductive material on top of said semi-conductor materials to form an upper electrode, except over the bridge or bridges of material, (e) removing from the strip, by cutting the bridge or bridges of material at a location which is not coated with said transparent or semi-transparent material, the substrates coated with said semi-conductor materials (16) and the upper electrode to form the individual photovoltaic cells.

3. A method according to claim 1, wherein the strip is cut into sections of strip each including a predetermined number of substrates prior to performance of the step of depositing the semi-conductor materials and the transparent or semi-transparent layer of electrically conductive material.

4. A method according to claim 1, further including a step of forming for each cell a contact pad for the upper electrode.

5. A method according to claim 4, wherein the contact pad is arranged at the periphery of the cell so that it does not extend above the cutting line.

6. A method according to claim 4, wherein the contact pads are continuous and extend over the entire periphery of the cells.

7. A method according to claim 1, further including a step of transferring a design such as an hour circle onto the surface of the upper electrode of each cell.

8. A method according to claim 1, wherein each cell is also pierced substantially at its centre, prior to performance of the step of depositing the semi-conductor materials and the transparent or semi-transparent layer of electrically conductive material.

9. A method according to claim 1, wherein the layer of said semi-conductor materials is deposited by plasma, while the transparent or semi-transparent layer of electrically conductive material forming the upper electrode is deposited by vapor deposition.

10. A method according to claim 1, wherein the removal step comprises applying pressure onto the cells on the side of the upper electrode thereof.

11. A method according to claim 10, wherein, prior to performance of the removal step, the method includes the additional steps of:

depositing a layer of protective material on top of the layer forming the upper electrode, removing the protective layer in a peripheral zone of each individual cell in order to expose the transparent or semi-transparent layer of electrically conductive material in this zone, removing the transparent or semi-transparent layer of electrically conductive material from the peripheral zone, removing the remaining protective material.

12. A method according to claim 1, including an additional step of electrically testing the cells prior to the removal step.

13. A method according to claim 2, wherein the cutting step is performed by punching.

14. A manufacturing method according to claim 2, wherein step (d) includes a step of depositing a protective material on the bridge or bridges of material prior to the deposition of the transparent or semi-transparent conductive material, and removing the protective material with the material of the layer forming the upper electrode prior to the performance of step (e).

15. A manufacturing method according to claim 1, wherein the strip is made of stainless steel.

* * * * *